(12) United States Patent
Rinko et al.

(10) Patent No.: US 11,271,127 B2
(45) Date of Patent: Mar. 8, 2022

(54) OPTICAL SHIELD FOR PHOTOVOLTAIC CELL

(71) Applicant: OY ICS INTELLIGENT CONTROL SYSTEMS LTD, Helsinki (FI)

(72) Inventors: Kari Rinko, Helsinki (FI); Tero Tuohioja, Espoo (FI)

(73) Assignee: OY ICS INTELLIGENT CONTROL SYSTEMS LTD, Helsinki (FI)

( * ) Notice: Subject to any disclaimer, the term of this patent is extended or adjusted under 35 U.S.C. 154(b) by 0 days.

(21) Appl. No.: 16/487,698

(22) PCT Filed: Feb. 22, 2018

(86) PCT No.: PCT/FI2018/050132
§ 371 (c)(1),
(2) Date: Aug. 21, 2019

(87) PCT Pub. No.: WO2018/154185
PCT Pub. Date: Aug. 30, 2018

(65) Prior Publication Data
US 2020/0058816 A1    Feb. 20, 2020

Related U.S. Application Data

(60) Provisional application No. 62/461,934, filed on Feb. 22, 2017.

(51) Int. Cl.
*H01L 31/054* (2014.01)
*H01L 31/0224* (2006.01)
*H01L 31/048* (2014.01)

(52) U.S. Cl.
CPC .. *H01L 31/0547* (2014.12); *H01L 31/022425* (2013.01); *H01L 31/048* (2013.01)

(58) Field of Classification Search
None
See application file for complete search history.

(56) References Cited

U.S. PATENT DOCUMENTS

| 5,076,857 A | 12/1991 | Nowlan |
| 5,772,791 A | 6/1998 | Laing |
| 2009/0194148 A1 | 8/2009 | Taguchi |
| 2009/0218651 A1 | 9/2009 | Frolov et al. |

(Continued)

FOREIGN PATENT DOCUMENTS

TW    201232791 A    8/2012

OTHER PUBLICATIONS

International Search Report and Written Opinion, PCT/FI2018/050132, dated Apr. 18, 2018 (13 pp.).

(Continued)

*Primary Examiner* — Jayne L Mershon
(74) *Attorney, Agent, or Firm* — Eversheds Sutherland (US) LLP

(57) ABSTRACT

An optical shield for a photovoltaic cell is provided, comprising an at least one carrier element, the carrier element comprises a number of embedded optically functional cavities arranged into an at least one predetermined optical relief pattern, wherein each embedded optically functional cavity in the at least one carrier element is positioned and aligned over an individual surface structure, such as an electrode, a contact, a finger, or a busbar, provided on the surface of the photovoltaic cell.

18 Claims, 5 Drawing Sheets

(56) References Cited

U.S. PATENT DOCUMENTS

| | | |
|---|---|---|
| 2009/0242013 A1 | 10/2009 | Taguchi |
| 2012/0103394 A1 | 5/2012 | Khazeni et al. |
| 2012/0229911 A1* | 9/2012 | Rodriguez-Parada ........................ H01L 31/0547 359/642 |
| 2014/0041719 A1 | 2/2014 | Haag et al. |
| 2014/0311570 A1* | 10/2014 | Raymond .............. G02B 5/045 136/259 |

OTHER PUBLICATIONS

Extended European Search Report for European Patent Application No. 18757710.1, dated Dec. 3, 2020 (7 pp.).

\* cited by examiner

OPTICAL SHIELD FOR PHOTOVOLTAIC CELL

CROSS-REFERENCE TO RELATED APPLICATIONS

This application claims the benefit of priority of U.S. Provisional Patent Application No. 62/461,934, filed Feb. 22, 2017, which is incorporated by reference in its entirety, and PCT Patent Application No. PCT/FI2018/050132, filed Feb. 22, 2018, and published as WO 2018/154185, which is incorporated by reference in its entirety.

FIELD OF THE INVENTION

Generally the present invention relates to optics. In particular, the present invention concerns an optical shield for surface structures, such as contacts, electrodes, fingers and busbars, provided on a photovoltaic cell.

BACKGROUND

Typically, a photovoltaic (PV) cell or a PV material, especially poly- and monocrystalline silicon, has surface structures, such as contacts, electrodes, fingers, and/or busbars covering 5% up to 10% of the PV surface. These surface contacts are typically silver electrodes produced by mask printing and having 85% reflectivity. Such contacts generally cause reflection and shading loss, which means approximately 5% to 10% optical loss and, in overall, the same amount of decreased cell output electricity.

From the other hand, minimizing total amount and size of the surface structures on the (top) surface of the photovoltaic cell will cause increased resistance and associated electricity losses for the overall cell power output. In this regard, conventional contact- and/or electrode design is a tradeoff between those two parameters.

Additionally, size, amount, periods and/or location of the abovementioned PV cell structures have an impact on such factors, as internal electrical resistance, transmitted electrical current and high regional doping vs. low reginal doping. These factors cause decrease or increase in the total PV cell power output.

At present and expectedly also in future, architecture, design and construction of PV cells is/will be based on provision of contacts and/or electrodes on the surface of said cell (FIGS. 1A and 1B). Available contact-free solutions combine a higher manufacturing price with lower yields; thereby, domination of such solutions in PV cell design and architecture is not a subject of immediate relevance.

SUMMARY OF THE INVENTION

An objective of the present invention is to at least alleviate each of the problems arising from the limitations and disadvantages of the related art. The objective is achieved by various embodiments of an optical shield assembly for a photovoltaic cell, according to what is defined in the independent claim 1.

In preferred embodiment an optical shield for a photovoltaic cell is provided, with an at least one carrier element comprising a number of embedded optically functional cavities arranged into an at least one predetermined optical relief pattern, wherein each embedded optically functional cavity in said at least one carrier element is positioned and aligned over an individual surface structure provided on a surface of the photovoltaic cell, such as an electrode, a contact, a finger, or a busbar.

In some embodiments, the optical shield further comprises a flat, planar base layer element disposed, with regard to the at least one carrier element, such that the optically functional cavities reside between the layers defined by said at least one carrier element and the base layer element.

In some embodiments, the optically functional cavities are filled with an internal medium material having a refractive index different from the refractive index of a medium material surrounding said cavities. In further embodiments, each embedded optically functional cavity is configured, in terms of size, shape, dimensions and disposition thereof, for an at least one of an reflective function, a refractive function, a deflective function, and a diffractive function.

In some embodiments, an at least one carrier element and/or the base element are plastic polymer, glass, or resin.

In some preferred embodiments, the embedded optically functional cavities are provided in the form of V-shaped grooves.

In some embodiments, the cavities are filled with an internal medium material provided in fluidic or solid form, which material can be selected from the group consisting of: air, gas, and liquid.

In some further embodiments, each embedded optically functional cavity is at least partially coated by an optically functional coating, wherein an optical function of said coating includes an at least one of the: specular reflection, diffusive reflection, and wavelength-selective reflection.

In some embodiments, in terms of dimensional parameters and disposition thereof within the optical relief pattern, the individual embedded optically functional cavities correspond to the surface structures provided on the surface of the photovoltaic cell.

In some additional embodiments, the optical shield comprises at least two carrier elements disposed one on the other, wherein each carrier element comprises a number of embedded optically functional cavities arranged into an at least one predetermined optical relief pattern, and wherein the dimensions, shape and periodicity of said optically functional cavities in the at least one optical relief pattern are individually adjustable for each carrier element.

In some embodiments, the optical shield is configured to cover an entire surface of the photovoltaic cell. In some other embodiments, the optical shield is configured as a number of discrete elements, wherein each discrete element is positioned and aligned over the individual surface structure provided on a surface of the photovoltaic cell. In still further embodiments, the optical shield of claim comprises the discrete elements arranged such, to form a grid.

The optical shield can be further configured as a film, a plate or a strip.

In another aspect, a photovoltaic cell is provided, according to what is defined in the independent claim 17 and comprising the optical shield according to the previous aspect. In some embodiments, the photovoltaic cell comprises the optical shield disposed under a protective cover thereof.

The utility of the present invention arises from a variety of reasons depending on each particular embodiment thereof. At a first stand, the present invention is based on fully integrated, embedded cavity optics, provided as a number of optically functional cavities forming an at least one optical relief pattern within a carrier element, which forms an optical shield for such surface structures of a photovoltaic cell as the contacts, electrodes, fingers and/or busbars.

The embedded optical solution presented hereby allows avoiding light reflection and shading losses caused by the contacts and/or electrodes on a conventional PV cell (see FIG. 1B showing incoming light 31, incident on a surface structure 10, getting immediately reflected 32 outside the PV cell). Embedded optics, such as optically functional cavities, are positioned in vicinity to the above identified individual surface structures, thus forming an optical shield, which guides light onto PV silicon surfaces, thus preventing light from hitting said individual surface structures and being reflected out of the PV cell, accordingly.

Present invention further provides flexibility in terms of varying dimensions, shape and periodicity of the optically functional cavities, and fill material thereof, within the at least one optical relief pattern, thereby said pattern can be configured as a refractive-, diffractive- or hybrid-optics, the latter combining reflection, deflection, refraction and/or diffraction functions. Multi-layer solutions can be further manufactured, wherein a first layer forms an optical shield and a second and/or further layer, comprising the integrated cavity-optics in the same manner as the first layer, is imparted with an additional optical function, such as light directing and redirecting, diffusing, reflecting, coupling, and the like.

The term "surface structure" is utilized in the present disclosure to generally indicate the contacts, electrodes, fingers, busbars, and the like, provided on the surface of a photovoltaic cell.

BRIEF DESCRIPTION OF THE DRAWINGS

Different embodiments of the present invention will become apparent by consideration of the detailed description and accompanying drawings, wherein:

FIGS. 1A and 1B illustrate conventional solutions for a photovoltaic cell, wherein FIG. 1A shows contact lines at the surface of a solar (photovoltaic) cell, and FIG. 1B shows a solar panel having a contact or contacts on the top surface thereof, from which incident light gets reflected away (reflected ray) such, that no photon absorption can occur.

DETAILED DESCRIPTION OF THE EMBODIMENTS

Figure 1A:
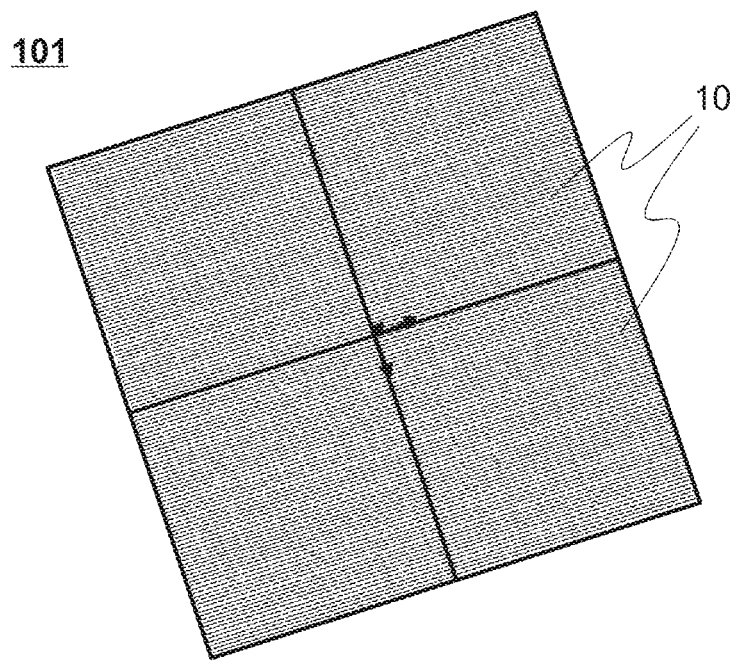
Figure 1B:
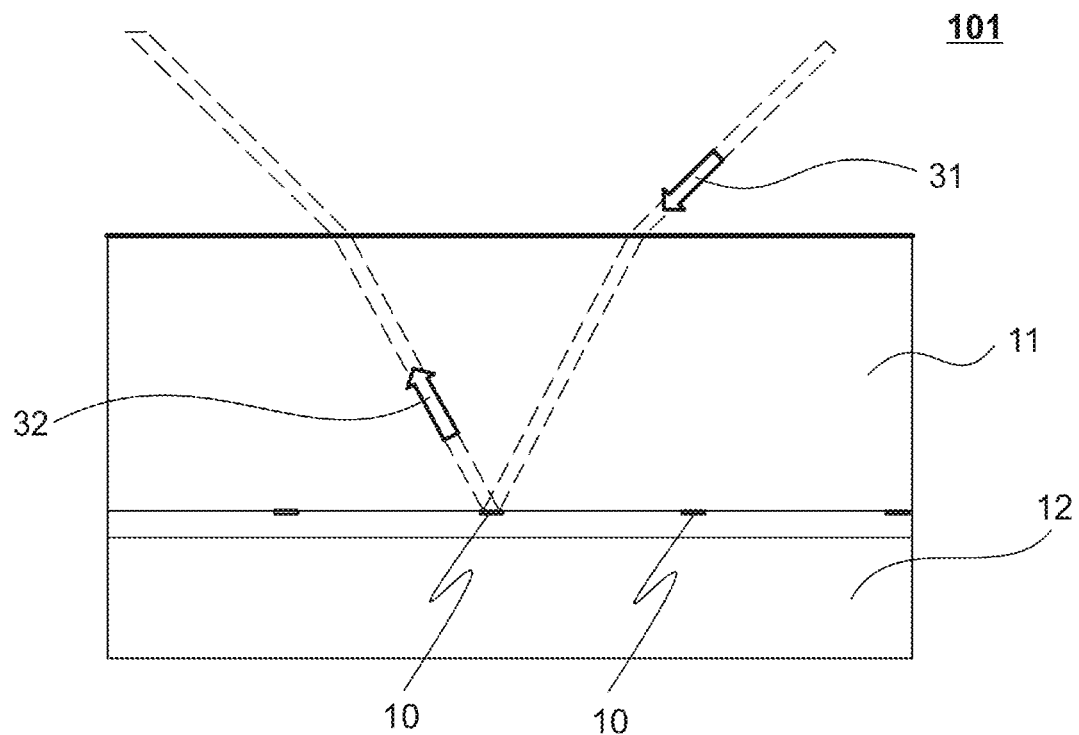

Detailed embodiments of the present invention are disclosed herein with the reference to accompanying drawings. The same reference characters are used throughout the drawings to refer to same members. Following citations are used for the members:
201, 201A—a photovoltaic cell,
10—a surface structure on the surface of the PV cell,
11, 11A—a carrier element with an optical function,
12—a body of the PV cell,
13—an adhesive layer,
14—a topmost protective layer for the PV cell,
20, 20A—an optical shield assembly,
21—a base layer element for the carrier element 11,
31, 32—incident light and reflected light, accordingly,
33—received light,
51, 51A—optically functional cavities,
52, 52A—an optical relief pattern.

Figure 2:
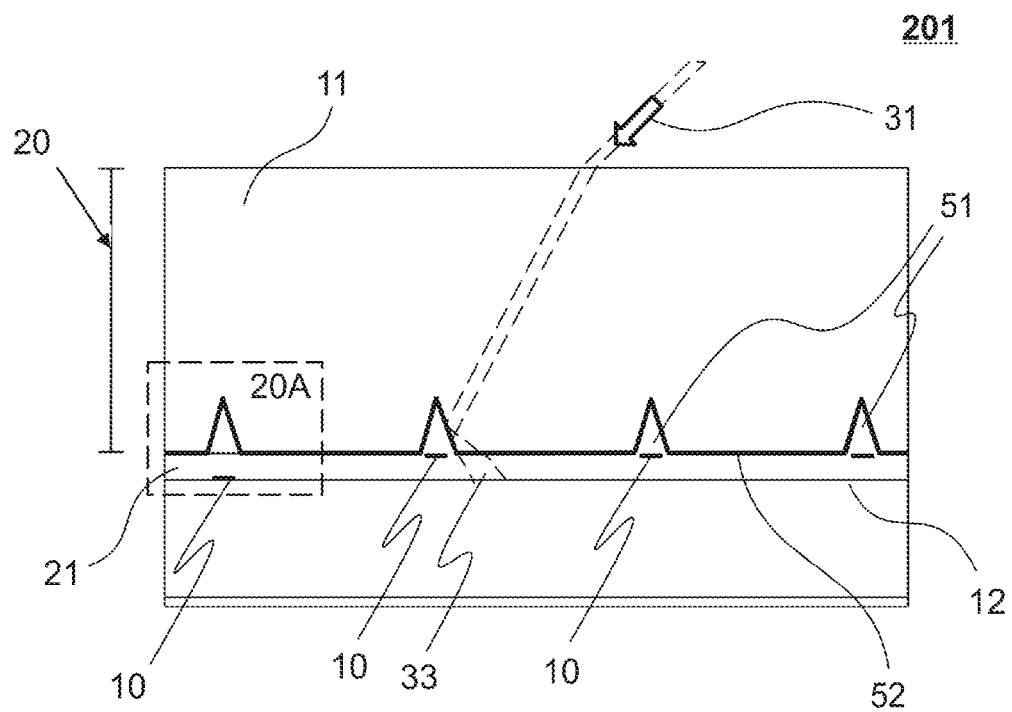
FIGS. 2, 3, 4 and 5 illustrate optical shield solutions, according to various embodiments of the present invention.

FIG. 2 illustrates, at 20 a concept underlying various embodiments of an optical shield assembly, hereafter, the optical shield, for a photovoltaic cell, indicated by a reference numeral 201. The optical shield 20 thus comprises an at least one flat, planar carrier element 11 with a number of optically functional cavities 51 arranged into an at least one predetermined optical relief pattern 52 (emphasized by a bold line, FIG. 2). Said at least one carrier element 11 is preferably made of a plastic polymer, glass, resin or ceramic material.

In one embodiment, the carrier element 11, which forms the optical shield 20, is advantageously disposed on a (topmost) surface of a body 12 of the photovoltaic cell.

It is preferred that the optical shied is provided as a flat, planar, uniform element with smooth, unbroken upmost and lowermost faces/sides. To implement that, the optical shield embodied as 20A and depicted on FIG. 2 as a dashed box, further comprises a base layer element 21, configured as an entirely flat, planar layer made of the same material as the carrier element 11, or of an alternative material selected from: plastic polymer, glass, resin or ceramic material. For example, both layers 11 and 21 may be made of a plastic polymer; alternatively, the carrier layer 11 may be a plastic polymer, and the base layer element 21 may be glass. The optical shield assembly 20A can provide coverage for an entire surface of the PV cell body 12. Configuration 20A is further shown on FIG. 6.

In some instances, the carrier element 11 is disposed between a body of said PV cell and a protective cover thereof, such as a cover glass or plastic (not shown). Thereby, the photovoltaic cell 201 can comprise the optical shield 20 disposed under the protective cover, accordingly.

Alternatively, the optical shield 20 can be provided as a layer adhered to a lower surface (a surface that faces the PV cell) of the protective cover (now shown), or a part integral to said protective cover.

Each optically functional cavity 51 is further positioned and aligned over an individual surface structure 10 provided on a surface of the PV cell 201. The individual surface structure 10 is non-exclusively provided as an electrode, a contact (a contact pad or a -plate), a finger, or a busbar.

All above mentioned structures are electrical conductors configured to conduct direct current (DC) from the PV cells to the inverter(s). The fingers (also referred to as finger-like contacts or finger electrodes) are thin, metallic lines that collect and deliver energy from a solar cell to the busbars. Busbars (also referred to as busbar contacts or busbar electrodes) are typically made of aluminum or silver-plated copper and disposed perpendicular to the fingers.

The optical cavities 51 thus form a fully embedded optical pattern integrated at an interface between the carrier element 11 and the base layer 21 (configuration 20A), or between the carrier element 11 and the surface of the PV cell body 12 (configuration 20).

Optically functional cavities 51 are dimensioned within a range of 10 to 1000 um in height, thus being in accord with dimensions and size of the underlying PV cell surface structures 10. Provision of the optical shield 20 configured, in terms of cavities 51, for nanoscale substructures is not, however, excluded.

The optical shield 20 is thus formed by the at least one carrier element 11 with a number of embedded optically functional cavities 51 (cavity optics), which cavity optics is based on an internal medium material, such as fluid (air, gas, liquid) or solid having optimized refractive index in comparison a surrounding material. The cavities 51 are thus preferably filled with an internal medium material having refractive index different from the refractive index of a medium material surrounding said cavities. It is preferred that the refractive index of the medium is lower that the refractive index of the surrounding material. One preferred internal medium material (fill material) is air. Another preferred internal medium material is a substantially solid material with a low refractive index, such as silicone, which enables provision of a total internal reflectance (TIR) function. By the "low refractive index material" we refer to the material, whose refractive index is lower than the refractive index of the medium material surrounding said cavities, such as the material the carrier element 11 is made from.

On the other hand, each embedded optically functional cavity 51 can be at least partially coated by an optically functional coating (not shown), wherein an optical function of said coating includes an at least one of the: specular reflection, diffusive reflection, and wavelength-selective reflection. This coating could be partially or totally applied onto all cavity walls. Hybrid coatings with nano-optical features constitute another feasible solution. Thus, the coating can comprise nanocrystals, for example, and be configured as an antireflective (AR) coating and/or a self-cleaning coating.

In preferred embodiments, the cavities 51 are provided in the form of grooves or depressions extending into an either direction of the carrier element 11. In some configurations, said grooves are arranged into substantially parallel rows. In other configurations the grooves can be positioned crosswise to form a grating.

In preferred embodiments, the cavities (grooves) 51 are configured as V-shaped grooves (V-grooves), preferably, inverted V-grooves (with a V-shape provided upside down). In practice, in terms of dimensions, such as size, width, height, length, the pattern 52, including the cavities 51, is dependent on the dimensions of the surface structures 10, accordingly. Apart from grooves, the cavities 51 can be further provided as distinct elements, such as V-shaped depressions (e.g. prismatic). Moreover, apart from or additionally to V-shapes, the cavities can be shaped differently, such as slanted triangular shapes, rectangular shapes, trapezoidal shapes, concave lens-like shapes, and the like. The pattern 52 can thus be formed with a single profile (all cavities have identical shape) or a multi-profile (cavities have varying shapes).

It is preferred that dimensions, shape and periodicity of the optically functional cavities within each optical relief pattern, are individually adjustable for each carrier element. The term "adjustable" is utilized within a meaning of "variable" or "modifiable".

Upon positioning and aligning the predetermined relief pattern 52, typically the V-groove solution, on top of the surface structures (e.g. contacts and/or electrodes), incident light 31 is TIR-reflected to be deviated from its original path (FIG. 2). Thereby, instead of being reflected outside the PV cell or absorbed by the conductive structures 10, as it typically occurs in conventional solutions, incident light 31 is incoupled, directed towards the PV cell and collected at the silicon surface thereof, thus contributing to power generation. Such incoupled and power generation-contributing light is referred to as "received light" and is indicated by a reference numeral 33. Generation of electrons in the PV cell can be considered as a function of flux of photons. The generation rate G is directly proportional to the flux of photons per unit area per second, NO, in accordance with the equation 1.

$$G = \alpha N_0 e^{-\alpha x}$$ Equation 1:

All incident light 31, such as sunlight, which is incident to/incoupled at a solar panel, is refracted at a top surface thereof, typically made of glass or plastic; thereby angular distribution inside a solar cell stack is defined within ±42° from the surface normal. In order to have all incident light 31 to experience TR at the V-groove 51 surface, the groove profile with an opening angle (also referred to as a prism angle or a V-groove angle alpha ($\square$), FIG. 4) of at least 12° is required. However, when taking into account illumination from the sun during an entire annual period, said angular distribution is concentrated mostly within ±50° from the surface normal. Therefore, the V-groove angle profile can be designed with a larger opening and still provide good collection efficiency. Data in Table 1 below is a simulation result using a cumulative, annual sunshine illumination data from Morocco with and without the V-groove solution (the optical shield 20) in the solar panel. The coverage area for all surface structures 10, such as surface contacts, in the model was about 10%.

TABLE 1

Comparative data obtained from solar panels with and without the optical shield 20. Solutions comprising the optical shield 20 are referred to as "ICS air cavity" with varying prism angles.

| | Normalized, collected light energy | Percentage improvement to typical panel |
| --- | --- | --- |
| Panel without any contacts (reference) | 1 | — |
| Typical panel with contacts alone | 0.898 | — |
| ICS air cavity, prism angle of 12° | 0.999 | 10.2% |
| ICS air cavity, prism angle of 30° | 0.993 | 9.6% |
| ICS air cavity, prism angle of 50° | 0.982 | 8.6% |
| ICS air cavity, prism angle of 70° | 0.952 | 5.7% |

Figure 3:
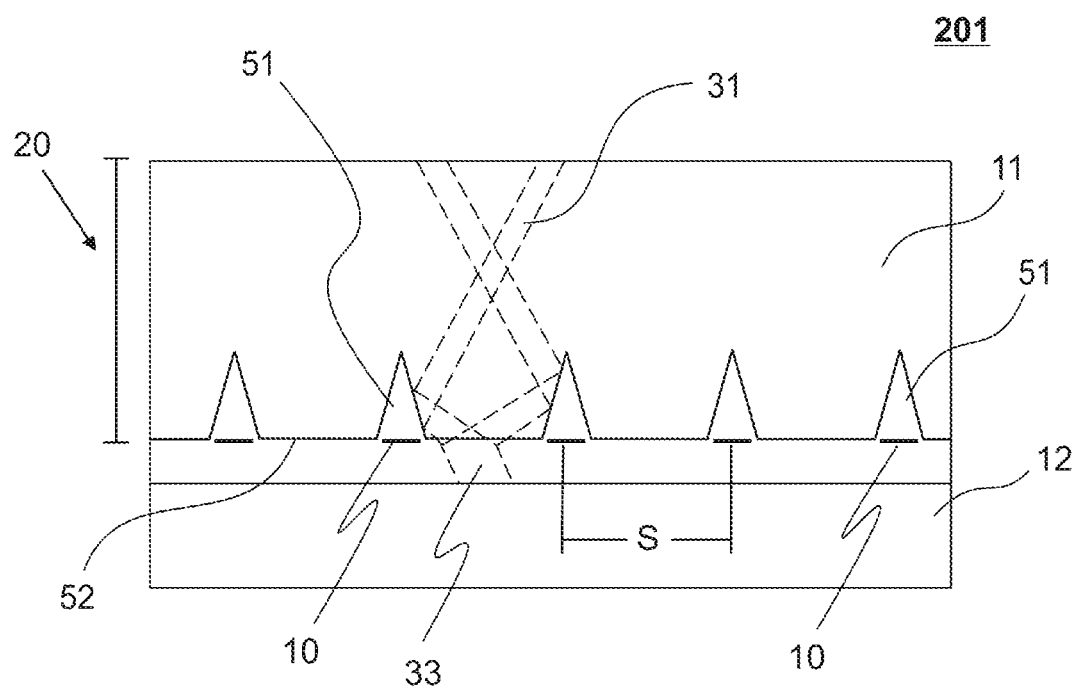

From the comparative results above it is clear, that the surface contact design can be optimized in terms of minimizing electrical loss without taking reflection- and/or shading loss into consideration. Electrical loss is defined by current multiplied by resistance. In principle, total area occupied by the surface structures 10 can be as high as 20-30% with regard to an entire solar cell or a panel, so as to enable collecting 95-98% of all available (incident) light by utilizing the contact shield assembly 20 optics. This is an important feature, when considering design optimization for the surface structures 10, such as contact layers, on an emitter (i.e. the topmost surface of the PV cell body 12). A fractional power loss can be written down as a function of a distance S between the structures 10, such as contact leads (see equation 2), wherein the distance S is provided as a distance between the middle points of the structures 10 (FIG. 3). It is noteworthy that the distance S is provided as to a power of two (S2). In theory, significant power loss reductions can be achieved, when the distance S is reduced twice or even three times, compared to conventional solutions.

$$P_{\% \, lost} = \frac{P_{loss}}{P_{gen}} = \frac{pS^2 J_{MP}}{12 V_{MP}}$$ Equation 2

Figure 5:
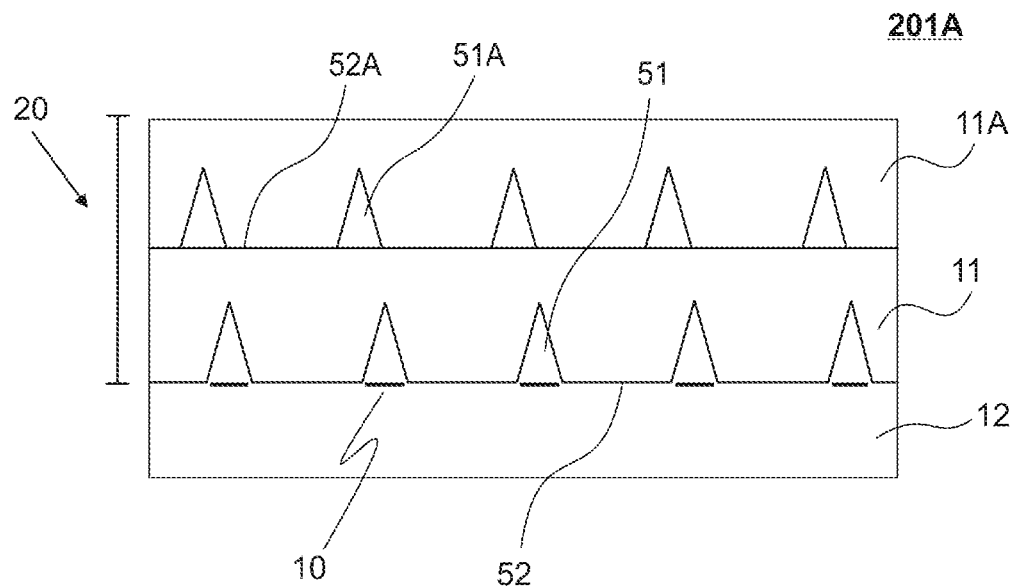

FIG. 5 further shows a multi-layer configuration, in which the PV cell 201A comprises the optical shield 20 with at least two carrier elements 11, 11A, wherein each carrier element comprises a number of embedded optically functional cavities 51, 51A arranged into an at least one predetermined optical relief pattern 52, 52A. The carrier element 11 thus forms a shielding structure for a PV cell surface 12 and the surface structures 10 located thereon, whereas the carrier element 11A bears an additional optical function, including, but not limited to: light directing and redirecting, diffusing, reflecting, coupling, and the like.

For all configurations, it is preferred that, the dimensions, shape and periodicity of the cavities 51, 51A, within the pattern(s) 52, 52A are adjustable for each individual carrier element 11, 11A.

The optical shield 20 of the present invention can be manufactured and integrated into the PV cell 201, 201A by conventional production methods. Basic configuration for the optical shield 20 is a film, preferably, a thin film. Said film is placed onto each PV cell during production such, as to align the cavities 51 over the surface structures 10. This optical shield film is produced preferably by roll-to-roll- or roll-to-sheet methods, which generate die-cuts according to the PV cell size. This method can produce massive volumes at low cost. Film material can be optical plastic, resin, or ceramic material. One preferred material is optical silicone, which is highly UV- and temperature resistant, especially, in long-term applications.

The optical contact shield 20 provided as a film can be applied directly on each PV cell by an in-line lamination unit after manufacturing the surface structures 10, such as the contacts, and anti-reflective coatings, for example. This is very applicable solution with minimized arrangements. Thereafter each PV cell will be handled normally in a next process phase. Lamination adhesive 13 (FIG. 4) selected from: silicone, EVA, olefin based layers, and the like, can be further utilized.

In further embodiments, the optical shield 20, configured as a film, can be applied onto a bottom side of a topmost glass layer that forms a protective cover of the PV cell. In such an instance, the entire glass cover alignment (in terms of cavities 51) needs to match with all PV cells in a module.

Figure 4:
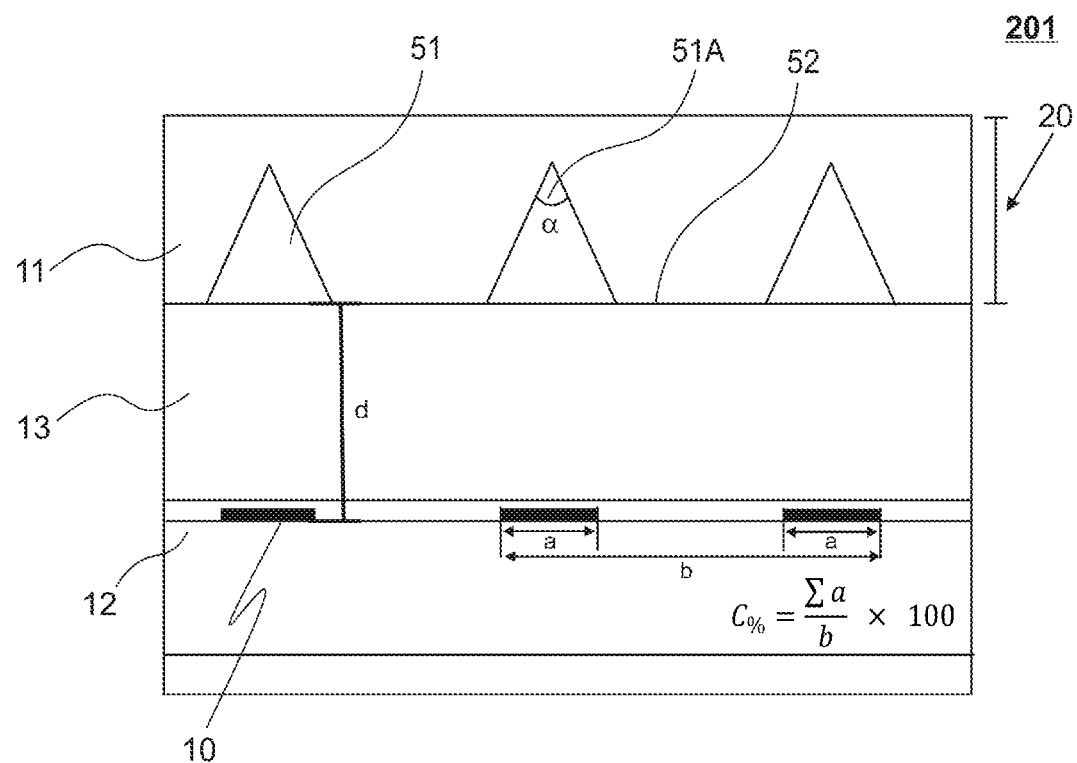

Distance d (FIG. 4) between the optical contact shield 20 and the PV cell surface, profiles of optical cavities, top angle parameters (prism angle, alpha) and its relationship with the contacts surface coverage (an entire area occupied by the surface structures 10) can be simulated and optimized. FIG. 4 and Table 2 thus present a number of simulated and optimized solutions and achieved gain.

TABLE 2

Simulated and optimized solutions for the optical contact shield 20, configured as a film, according to the present invention, and achieved gain.

| Distance d from silicon surface/mm | Prism opening angle α/° | Contact surface coverage C/% | Collected available light energy | Gain |
|---|---|---|---|---|
| 0.106 | 31.333 | 8.556 | 0.994 | 108.6% |
| 0.106 | 37.778 | 8.556 | 0.993 | 108.6% |
| 0.040 | 44.222 | 8.556 | 0.991 | 108.4% |
| 0.171 | 18.444 | 8.556 | 0.990 | 108.3% |
| 0.106 | 44.222 | 8.556 | 0.990 | 108.3% |
| 0.171 | 31.333 | 8.556 | 0.987 | 107.9% |
| 0.171 | 24.889 | 8.556 | 0.987 | 107.9% |
| 0.040 | 50.667 | 8.556 | 0.986 | 107.9% |
| 0.171 | 37.778 | 8.556 | 0.986 | 107.8% |
| 0.106 | 50.667 | 8.556 | 0.985 | 107.7% |
| 0.171 | 44.222 | 8.556 | 0.983 | 107.5% |
| 0.040 | 57.111 | 8.556 | 0.982 | 107.3% |

TABLE 2-continued

Simulated and optimized solutions for the optical contact shield 20, configured as a film, according to the present invention, and achieved gain.

| Distance d from silicon surface/mm | Prism opening angle α/° | Contact surface coverage C/% | Collected available light energy | Gain |
|---|---|---|---|---|
| 0.106 | 57.111 | 8.556 | 0.980 | 107.2% |
| 0.237 | 18.444 | 8.556 | 0.979 | 107.1% |
| 0.171 | 50.667 | 8.556 | 0.979 | 107.1% |
| 0.237 | 31.333 | 8.556 | 0.976 | 106.8% |
| 0.237 | 24.889 | 8.556 | 0.976 | 106.7% |
| 0.237 | 37.778 | 8.556 | 0.975 | 106.7% |
| 0.302 | 18.444 | 8.556 | 0.974 | 106.6% |
| 0.040 | 63.556 | 8.556 | 0.974 | 106.5% |
| 0.171 | 57.111 | 8.556 | 0.973 | 106.4% |
| 0.106 | 63.556 | 8.556 | 0.972 | 106.3% |
| 0.237 | 44.222 | 8.556 | 0.972 | 106.3% |
| 0.302 | 31.333 | 8.556 | 0.971 | 106.2% |
| 0.302 | 24.889 | 8.556 | 0.971 | 106.2% |
| 0.302 | 37.778 | 8.556 | 0.970 | 106.1% |
| 0.040 | 18.444 | 4.778 | 0.999 | 105.0% |
| 0.106 | 18.444 | 4.778 | 0.999 | 104.9% |
| 0.040 | 24.889 | 4.778 | 0.998 | 104.8% |
| 0.106 | 24.889 | 4.778 | 0.998 | 104.8% |
| 0.171 | 18.444 | 4.778 | 0.997 | 104.7% |
| 0.040 | 31.333 | 4.778 | 0.996 | 104.6% |
| 0.106 | 31.333 | 4.778 | 0.996 | 104.6% |
| 0.171 | 24.889 | 4.778 | 0.995 | 104.5% |
| 0.171 | 31.333 | 4.778 | 0.994 | 104.4% |
| 0.040 | 37.778 | 4.778 | 0.993 | 104.2% |
| 0.106 | 37.778 | 4.778 | 0.993 | 104.2% |
| 0.171 | 37.778 | 4.778 | 0.992 | 104.1% |
| 0.237 | 18.444 | 4.778 | 0.991 | 104.1% |
| 0.106 | 44.222 | 4.778 | 0.991 | 104.1% |
| 0.040 | 50.667 | 4.778 | 0.990 | 104.0% |
| 0.237 | 24.889 | 4.778 | 0.990 | 104.0% |
| 0.040 | 44.222 | 4.778 | 0.990 | 104.0% |
| 0.106 | 50.667 | 4.778 | 0.990 | 104.0% |
| 0.171 | 44.222 | 4.778 | 0.989 | 103.9% |
| 0.237 | 31.333 | 4.778 | 0.989 | 103.8% |
| 0.040 | 57.111 | 4.778 | 0.987 | 103.7% |
| 0.106 | 57.111 | 4.778 | 0.987 | 103.7% |
| 0.171 | 50.667 | 4.778 | 0.987 | 103.7% |
| 0.237 | 37.778 | 4.778 | 0.986 | 103.6% |
| 0.302 | 18.444 | 4.778 | 0.986 | 103.5% |
| 0.106 | 63.556 | 4.778 | 0.985 | 103.5% |
| 0.040 | 63.556 | 4.778 | 0.985 | 103.5% |

Figure 6:
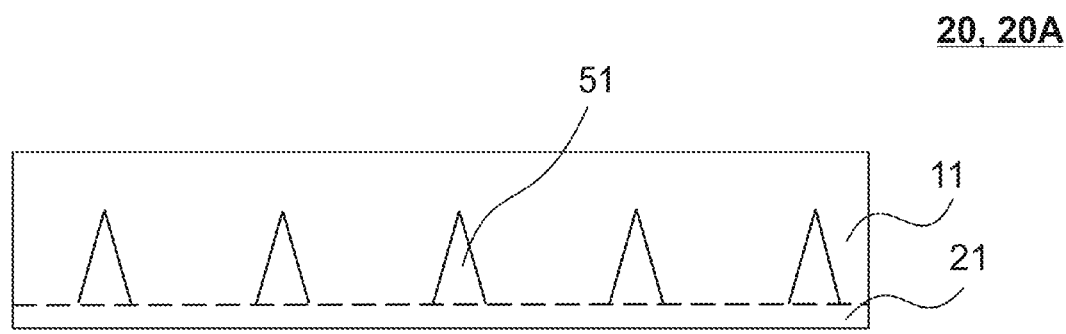
FIG. 6 shows an optical shield before its lamination on a photovoltaic cell.

FIG. 6 thus shows the optical contact shield 20, 20A with medium (e.g. air)-filled cavities 51 before its lamination on the PV cell. A dashed line between the layers 11 and 21 is indicative of the fact that both configurations (with and without the base layer 21) are feasible.

Figure 7:
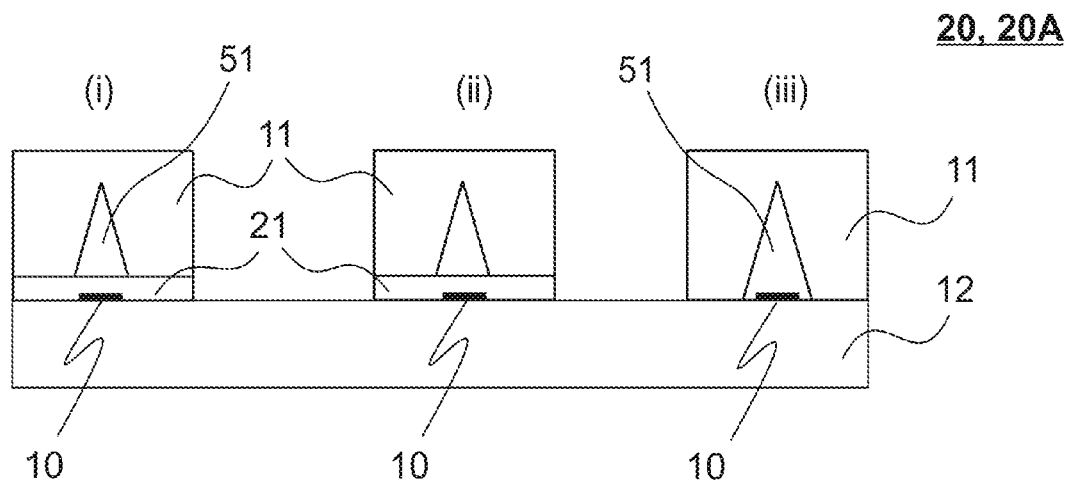
FIG. 7 shows a discrete optical shield solution, according to some embodiment.

Reference is further made to FIG. 7 showing the optical shield 20, 20A embodied as a number of discrete elements (indicated by blocks (i), (ii) and (iii)). Each discrete element (i), (ii) and (iii) can be provided as an individual film, a plate or a strip disposed on the PV cell body such as to align with the surface structures' (e.g. contacts') 10 layout. In some embodiments (configuration 20), the discrete element (iii) comprises an at least one carrier element 11; in some further embodiments (configuration 21), the discrete structures (i) and (ii) additionally comprise the base layer 21. Each discrete structure may comprise a single cavity 51 or a number of cavities. Discrete structures are distributed over a surface of the PV cell; however, providing no entire coverage thereof.

In some further embodiments, the discrete structures (i), (ii) and/or (iii) can be arranged such, to form a grid. The grid may be formed by a number of strip-like discrete structures arranged crosswise, or by a number of individual plate- or film-like structures arranged row-wise according to a predetermined order.

It is noteworthy, that each discrete structure (i), (ii) and/or (iii) comprises an at least one cavity optics element 51, and that said discrete structures are aligned with the surface structures 10 distributed on the solar cell.

Figure 8A:
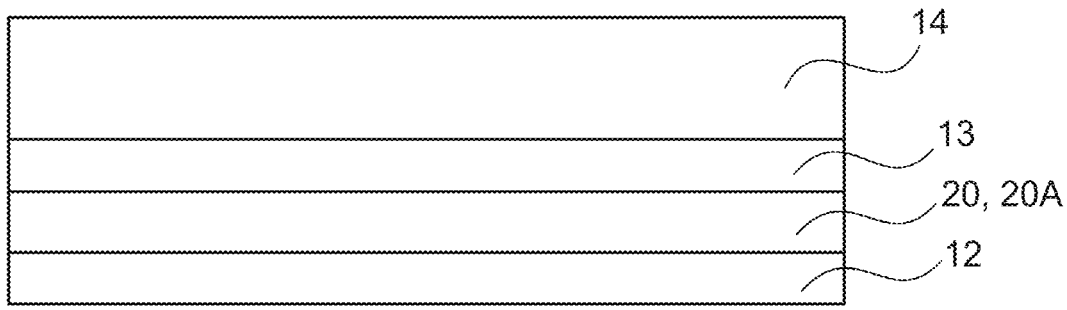
FIGS. 8A and 8B show different embodiments of a photovoltaic cell according to some aspect.
Figure 8B:
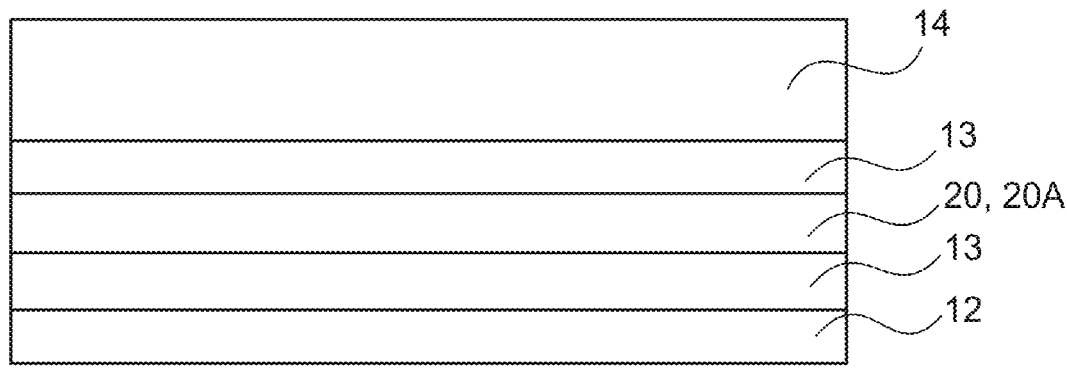

FIGS. 8A and 8B show different embodiments of the photovoltaic cell 201, 201A, comprising the optical shield embodied as 20, 20A. The shield 20, 20A can be embodied as a continuous film- or plate-like structure providing full coverage for the entire PV cell surface, or as a discrete structure distributed over the cavity optics elements 51.

The optical shield can be laminated by various methods and during different production stages, such as: a) onto a surface of the PV cell body 12, and b) between the PV cell body 12 and a protective layer 14, such as glass.

The optical shield 20, 20A can be thus provided with an adhesive layer 13 at one side (FIG. 8A) or both sides (lowermost- and uppermost faces, FIG. 8B).

The optical shield 20, 20A can be further mounted onto the PV cell body 12 by an automated production device, wherein mounting is implemented: a) precisely on the surface of the PV cell body 12; b) onto the surface of an entire PV module; and/or c) to form a "wire contact" with a surface of the PV cell or a —module during installation.

The present invention efficiently minimizes the optical power loss that consists of losses caused by reflection, shading losses, and losses due to incident light absorption into contact structures. The optical shield assembly provided hereby is a simple and cost-effective solution, which mitigates the abovementioned losses and gains efficiency for the PV cell power output.

By utilizing the optical shield assembly provided hereby, electrical losses can be minimized by 1) increasing amount of the surface structures 10 and their size, and 2) minimizing distance, gap and period between the surface structures 10, thus achieving minimized electrical current per a surface structure 10 (a contact) and resistance.

Additionally, this invention supports utilization of highly phosphorus doped (silicon) regions under larger surface structures 10, such as the contacts, in order to increase conductivity. This is beneficial when highly doped and low-doped regions are utilized, thereby high conductivity and a low carrier charge are achieved.

It is clear to a person skilled in the art that with the advancement of technology the basic ideas of the present invention are intended to cover various modifications included in the spirit and the scope thereof. The invention and its embodiments are thus not limited to the examples described above; instead they may generally vary within the scope of the appended claims.

The invention claimed is:

1. An optical shield for a photovoltaic cell, comprising:
a plurality of discrete structures (i), (ii) and/or (iii) each comprising at least one carrier element having at least one optically functional cavity embedded in the at least one carrier element,
wherein the embedded optically functional cavities are arranged into an at least one predetermined optical relief pattern, and
wherein each discrete structure and each embedded optically functional cavity in the at least one carrier element is capable of being positioned over and aligned with an individual surface structure provided on a surface of a photovoltaic cell body.

2. The optical shield of claim 1, wherein the individual surface structure disposed on the surface of the photovoltaic cell body is an electrode, a contact, a finger, or a busbar.

3. The optical shield of claim 1, wherein at least one discrete structure further comprises a flat, planar base layer element,
wherein the optically functional cavity in the at least one discrete structure resides between the planar base layer element and the at least one carrier element.

4. The optical shield of claim 1, wherein the optically functional cavities are filled with an internal medium material comprising a refractive index different from the refractive index of a medium material surrounding the cavities.

5. The optical shield of claim 1, wherein each embedded optically functional cavity is configured, in terms of size, shape, dimensions and disposition thereof, for an at least one of an reflective function, a refractive function, a deflective function, and a diffractive function.

6. The optical shield of claim 1, wherein the at least one carrier element or a base layer element is a plastic polymer, glass, or resin.

7. The optical shield of claim 1, wherein the embedded optically functional cavities comprises V-shaped grooves.

8. The optical shield of claim 1, wherein the embedded optically functional cavities are filled with an internal medium material provided in fluidic or solid form.

9. The optical shield of claim 8, wherein the internal medium fluidic material is selected from the group consisting of: air, gas, or liquid.

10. The shield of claim 1, wherein each embedded optically functional cavity is at least partially coated by an optically functional coating, and
wherein an optical function of the coating includes at least one of specular reflection, diffusive reflection, and wavelength-selective reflection.

11. The optical shield of claim 1, wherein each discrete structure (i), (ii), and/or (iii) further comprises at least two carrier elements arranged in a multi-layer configuration,
wherein each carrier element comprises a number of embedded optically functional cavities arranged into an at least one predetermined optical relief pattern, and
wherein the dimensions, shape and periodicity of the optically functional cavities in the at least one optical relief pattern are independently configured for each carrier element.

12. The optical shield of claim 1, wherein the discrete structures (i), (ii) and/or (iii) are arranged such, to form a grid.

13. The optical shield of claim 12, wherein the grid is formed with a number of discrete structures (i), (ii) and/or (iii) configured as strips and arranged crosswise.

14. The optical shield of claim 12, wherein the grid is formed with a number of discrete structures (i), (ii) and/or (iii) configured as plate structures or film structures and arranged row-wise according to a predetermined order.

15. A photovoltaic cell system, comprising:
a photovoltaic cell, and
the optical shield as defined in claim 1.

16. The photovoltaic cell system of claim 15, wherein the optical shield is disposed under a protective cover.

17. The photovoltaic cell system of claim 15, wherein in terms of dimensional parameters and disposition thereof within the optical relief pattern, each embedded optically functional cavities correspond to the surface structures disposed on the surface of the photovoltaic cell.

18. The photovoltaic cell system of claim 15, wherein the optical shield is configured to cover an entire surface of the photovoltaic cell.

* * * * *